(12) United States Patent
Cohen et al.

(10) Patent No.: US 11,386,539 B2
(45) Date of Patent: Jul. 12, 2022

(54) DETECTING DEFECTS IN A SEMICONDUCTOR SPECIMEN

(71) Applicant: Applied Materials Israel Ltd., Rehovot (IL)

(72) Inventors: Elad Cohen, Beer Sheva (IL); Yuri Feigin, Ashdod (IL); Lior Katz, Jerusalem (IL); Eyal Neistein, Herzliya (IL)

(73) Assignee: Applied Materials Israel Ltd., Rehovot (IL)

( * ) Notice: Subject to any disclaimer, the term of this patent is extended or adjusted under 35 U.S.C. 154(b) by 233 days.

(21) Appl. No.: 16/425,859

(22) Filed: May 29, 2019

(65) Prior Publication Data

US 2020/0380662 A1 Dec. 3, 2020

(51) Int. Cl.
*G06T 7/00* (2017.01)
*H01L 21/67* (2006.01)

(52) U.S. Cl.
CPC ...... *G06T 7/0004* (2013.01); *H01L 21/67288* (2013.01); *G06T 2207/30148* (2013.01)

(58) Field of Classification Search
CPC ........ G06K 9/00; G06K 9/3233; G06K 9/036; G06K 9/4628; G06K 9/6271; G06T 2207/30148; G06T 7/0004; H01L 21/67288; H01L 21/02; H01L 21/67242; H01L 22/12; H01L 22/24; H01L 22/34; G06N 3/08; G06N 3/0454
See application file for complete search history.

(56) References Cited

U.S. PATENT DOCUMENTS

| 6,411,378 | B1* | 6/2002 | Pike | G01N 21/956 356/237.2 |
| 2006/0067571 | A1* | 3/2006 | Onishi | G06T 7/001 382/149 |
| 2017/0177997 | A1* | 6/2017 | Karlinsky | G06K 9/6271 |
| 2019/0294923 | A1* | 9/2019 | Riley | G06K 9/6256 |

* cited by examiner

*Primary Examiner* — Michael J Vanchy, Jr.
(74) *Attorney, Agent, or Firm* — Lowenstein Sandler LLP

(57) ABSTRACT

A system and method for specimen examination, the system comprising a processing and memory circuitry (PMC) for: obtaining an image of at least a part of a specimen, the image acquired by an examination tool; receiving one or more characteristics of a defect of interest and a location of interest associated therewith; modifying within the image one or more pixels corresponding to the location of interest, wherein the modification is provided in accordance with a characteristic of the defect of interest, thereby planting the defect of interest into the image; processing the modified image to detect locations of potential defects of the specimen in accordance with a detection recipe; and determining whether the detected locations include the location of interest. Subject to the location of interest not being detected, modifying the detection recipe to enable detecting the planted defect of interest at the location of interest.

17 Claims, 3 Drawing Sheets

DETECTING DEFECTS IN A SEMICONDUCTOR SPECIMEN

TECHNICAL FIELD

The presently disclosed subject matter relates, in general, to the field of examination of a specimen, and more specifically, to methods and systems capable of automated detection of defects belonging to a new class.

BACKGROUND

Current demands for high density and performance associated with ultra large scale integration of fabricated devices, require submicron features, increased transistor and circuit speeds, and improved reliability. Such demands require formation of device features with high precision and uniformity, which, in turn, necessitate careful monitoring of the fabrication process, including frequent and detailed examination of the devices while they are still in the form of semiconductor specimens.

The term "specimen" used in this specification should be expansively construed to cover any kind of wafer, mask, and other structures, combinations and/or parts thereof used for manufacturing semiconductor integrated circuits, magnetic heads, flat panel displays, and other semiconductor-fabricated articles.

The term "defect" used in this specification should be expansively construed to cover any kind of abnormality or undesirable feature formed on or within a specimen.

The complex manufacturing process of specimens is not error-free and such errors may cause faults in manufactured devices. The faults may include defects that can harm operation of the device, and nuisances, which may be defects, but do not cause any harm or malfunction of the manufactured device. By way of non-limiting example, defects may be caused during the manufacturing process, due to faults in the raw material, mechanical, electrical or optical errors, human errors, or others. Further, defects may be caused by spatio-temporal factors, such as temperature changes of the wafer occurring after one or more manufacturing stages during the examination process, which may cause some deformations of the wafer.

Unless specifically stated otherwise, the term "examination" used in this specification should be expansively construed to cover any kind of detection and/or classification of defects in an object. Examination is provided by using non-destructive examination tools during or after manufacture of the object to be examined. By way of non-limiting example, the examination process can include scanning (in a single or in multiple scans), sampling, reviewing, measuring, classifying and/or other operations provided with regard to the object or parts thereof, using one or more examination tools.

Likewise, examination can be provided prior to manufacture of the object to be examined and can include, for example, generating an examination recipe(s). It is noted that, unless specifically stated otherwise, the term "examination" or its derivatives used in this specification, is not limited with respect to the size of the inspected area(s), to the speed or resolution of the scanning, or to the type of examination tools. A variety of non-destructive examination tools includes, by way of non-limiting example, optical tools, scanning electron microscopes, atomic force microscopes, etc.

The examination process can include a plurality of examination steps. During the manufacturing process, the examination steps can be performed a multiplicity of times, for example after the manufacturing or processing of certain layers, or the like. Additionally or alternatively, each examination step can be repeated multiple times, for example for different specimen locations or for the same specimen locations with different examination settings.

By way of non-limiting example, run-time examination can employ a two-step procedure, e.g. inspection of a specimen followed by review of sampled defects. During the inspection step, the surface of a specimen or a part thereof (e.g. areas of interest, hot spots, etc.) is typically scanned at relatively high-speed and/or low-resolution. The captured inspection image is analyzed in order to detect defects and obtain locations and other inspection attributes thereof. At the review step the images of at least some of the defects detected during the inspection phase are, typically, captured at relatively low speed and/or high-resolution, thereby enabling verification, classification and, optionally, other analyses of the at least some of the defects. In some cases both phases can be implemented by the same inspection tool, and, in some other cases, these two phases are implemented by different inspection tools. It is noted that data informative of the captured images and/or derivatives thereof are referred to herein also as "images".

GENERAL DESCRIPTION

Due to the large number of defects in a wafer, which may be in the order of magnitude of millions, it is impractical to expect that all defects are detected in one or more images captured during inspection, and that all detected defects are further checked. In accordance with certain aspects of the presently disclosed subject matter, it is important to make sure that defects located at specifically important or representative locations on the wafer, are indeed detected.

In accordance with certain aspects of the presently disclosed subject matter, there is provided an examination system to detect defects in a specimen. The system comprises a processing and memory circuitry (PMC) to: obtain an image of at least a part of a specimen, the image acquired by an examination tool, the image comprising a plurality of pixels; receive one or more characteristics of a defect of interest and a location of interest associated therewith; modify data informative of at least one pixel from the plurality of pixels and corresponding to the location of interest, wherein the modification is provided in accordance with the at least one characteristic of the defect of interest, thereby planting the defect of interest and obtaining modified image data; process the modified image data to detect locations of potential defects of the specimen in accordance with a detection recipe; and determine whether the detected locations include the location of interest.

In accordance with another aspects of the presently disclosed subject matter, there is provided a method of a specimen examination. The method comprises: obtaining an image of at least a part of a specimen, the image acquired by an examination tool comprising a plurality of pixels; receiving one or more characteristics of a defect of interest and a location of interest associated therewith; modifying data informative of at least one pixel from the plurality of pixels and corresponding to the location of interest, wherein the modification is provided in accordance with the at least one characteristic of the defect of interest, thereby planting the defect of interest and obtaining modified image data; processing the modified image data to detect locations of potential defects of the specimen in accordance with a detection recipe; and determining whether the detected locations include the location of interest.

In accordance with further aspects of the presently disclosed subject matter, and, optionally, in combination with other aspects, when the location of interest is not detected, the PMC can further modify the detection recipe to enable detecting the planted defect of interest at the location of interest. By way of non-limiting example, the detection recipe can comprise a set of instructions to: determining a grade for each pixel from the plurality of pixels, the grade indicative of a probability that the pixel reflects a defect or a part thereof; setting a threshold; and detecting as potential defects only pixels for which the respective grade exceeds the threshold. Subject to the location of interest not being detected, the PMC can further modify the threshold in the detection recipe to enable detecting the planted defect of interest at the location of interest.

In accordance with further aspects of the presently disclosed subject matter, and, optionally, in combination with other aspects, a value of one or more pixels can be changed to an absolute value. Optionally, obtaining the modified image data can comprise adding to a value of one or more pixels from the plurality of pixels, a second value provided as part of a characteristic. By way of non-limiting example, the location of interest can be absolute, repetitive, random, relative to a predetermined pattern, or relative to a predetermined location. By way of non-limiting example, a characteristic can be a type, a color, a geometrical characteristic, an amplitude, a parity, an electrical characteristic, or a physical characteristic.

Among advantages of certain embodiments of the presently disclosed subject matter is enabling a user to specify defects of interest and locations of interest associated therewith and to ensure that the detection recipe provides detection of the specified defects at the specified locations.

BRIEF DESCRIPTION OF THE DRAWINGS

In order to understand the invention and to see how it may be carried out in practice, embodiments will now be described, by way of non-limiting example only, with reference to the accompanying drawings, in which.

DETAILED DESCRIPTION OF EMBODIMENTS

Figure 1:
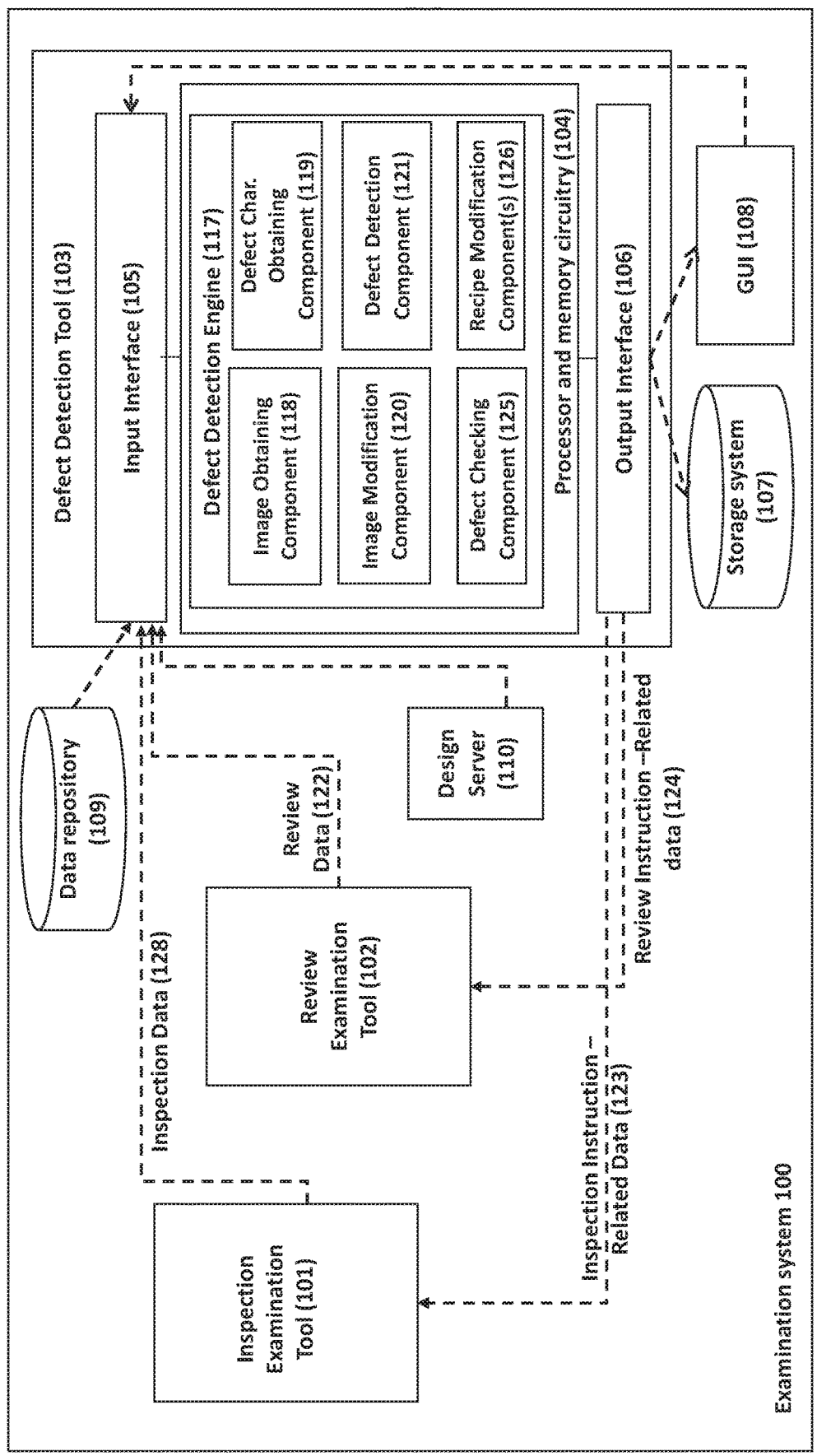
FIG. 1 illustrates a generalized block diagram of an examination system, in accordance with certain embodiments of the presently disclosed subject matter.

In the following detailed description, numerous specific details are set forth in order to provide a thorough understanding of the invention. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "processing", "computing", "representing", "calculating", "generating", "assigning", "selecting", "determining", "receiving", "training", "applying", "outputting" or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the classifier and PMC therein disclosed in the present application.

The terms "non-transitory memory" and "non-transitory storage medium" used herein should be expansively construed to cover any volatile or non-volatile computer memory suitable to the presently disclosed subject matter.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

The term "defect" in a specimen used in this specification, should be expansively construed to cover any kind of abnormality or undesirable feature formed on or within a specimen.

In a typical examination of an object, one or more images of the object are taken at relatively high speed and/or low resolution, and are then examined for detecting potential defects which may be further reviewed. Typically, a large number of potential defects are observed, for example in the order of magnitude of millions. Each potential defect may be associated with values for a number of characteristics descriptive of the defect or its environment. However, it is practically impossible to further review each such potential defect, to determine whether it is a real defect and/or to further examine it. Thus, a minority of the potential defects are detected upon the characteristics, reported, and may or may not be further reviewed.

When setting up a system for examining a specimen, there may be one or more defects of certain types, locations or other characteristics which are important to detect. Such importance may be due to known needs or requirements, previously known defects, or any other reason. Such defects may include, for example, short circuits, disconnections, or the like. Additional defects may be due to the need to examine a certain area of the examined object. However, if such defects are not reported, it may be unknown whether such defects were not present at the object, whether they are present, but were not detected as potential defects due to the detection algorithm, one or more thresholds, or the like.

Thus, testing the detection algorithm and thresholds for detecting these potential defects may not be possible, in the absence of relevant defects, or when such defects are not detected.

The disclosed subject matter provides a method and apparatus for testing the detection of required defects. Utilizing the disclosure, one or more characteristics of a defect of interest, and a location thereof may be received, for example from a user. Once an image is received from an examination device, and in particular an inspection device, the image may be modified, for example by modifying values of pixels in the image, in accordance with the characteristics and location of each such received defect.

This provides for obtaining a modified image which contains a defect that was not present in the examined object. Such defect may thus be referred to as a "planted" defect.

The detection may then proceed as usual. If a planted defect is detected among other defects, the detection may be assumed to operate satisfactorily with respect to the defect. If, however, the defect is not reported although it is known to be present in the image, the detection may be examined to determine the cause, for example handling of the defect type is missing, or improper thresholds. A further cause may be the instability of the examination recipe. For example, defects having the same description or location may be planted in multiple wafers. A defect being detected in some wafers and not detected in others may be due to the examination recipe being unstable and behaving differently for different wafers. Another possible cause may be instability of the manufacturing process, such that differences between wafers are responsible for the detection of some defect in one wafer, and misdetection of the same defect in another wafer. While real defects may vary between wafers, the planted defects are the same, which provides for assessing difference between the wafers. It will be appreciated that further causes for misdetection may exist.

The defect planting, followed by checking the detection results, may be performed as part of the examination setup. Additionally or alternatively, detection may be carried out during manufacturing if it is required to review a particular area of the object, regardless of whether a defect was detected therein or not.

Bearing this in mind, attention is drawn to FIG. 1 illustrating a generalized block diagram of an examination system in accordance with certain embodiments of the presently disclosed subject matter. Examination system 100 illustrated in FIG. 1 can be used for examination of a specimen (e.g. of a wafer and/or parts thereof) as a part of specimen fabrication. Examination can be part of the examination setup, object fabrication, and can be carried out during manufacturing the object, or afterwards. The examination system can include a variety of examination tools, for example, one or more inspection examination tools 101 for capturing data informative of inspection images (typically, at relatively high speed and/or low resolution), and one or more review examination tools 102 for capturing data informative of review images of at least some defects detected by inspection tools 101 (typically, at relatively low speed and/or high resolution). The illustrated examination system 100 further includes a computer-based automated defect detection tool 103 capable of automatically detecting defects within an image, such as an image captured by inspection examination tool 101. By way of non-limiting example, defect detection may have different purposes, such as determining which defects to review with review examination tool 102, determining a status of the examined object, defect classification, or others.

A user can view the detected or reported defects with the help of GUI 108. Further, GUI 108 may enable the user (and/or management system) to set parameters for certain detection tasks, set thresholds, introduce defects to be planted, optimize the detection results in accordance with user requirements, or the like.

Defect detection tool 103 can be operatively connected to one or more inspection tools 101 and/or one or more review tools 102. Optionally, defect detection tool 103 can be fully or partly integrated with one or more inspection tools 101 or with one or more review tools 102. Defect detection tool 103 can be further operatively connected to design server 110 and/or data repository 109. As further detailed with reference to FIGS. 2-3, data repository 109 can include, for example, data related to defects that should be planted in a captured image, in order to detect these planted defects, check whether the planted defects are detected, or analyze why such defects were not detected.

A specimen can be examined by inspection tool 101 (e.g. an optical inspection system, low-resolution SEM, etc.). The resulting images and/or derivatives can be processed (optionally together with other data as, for example, design data and/or defect classification data) to detect potential defects for review.

A subset of potential defect locations detected for review can be reviewed by review tool 102 (e.g. a scanning electron microscope (SEM) or Atomic Force Microscopy (AFM), etc.). The subset can include one or more of the planted defects, subject to the applied detection algorithms and relevant thresholds.

Additionally or alternatively, data 122 (referred to hereinafter as review data) informative of review images and/or derivatives thereof and respective associated metadata can be transmitted—directly or via one or more intermediate systems—to defect detection tool 103. It is noted that review data 122 can include data generated by the one or more intermediate systems as derivatives of review images.

Defect detection tool 103 can include a processor and memory circuitry (PMC) 104 operatively connected to a hardware-based input interface 105 and/or to a hardware-based output interface 106. PMC 104 can provides processing necessary for operating defect detection engine 117 as further detailed with reference to FIG. 3, and includes a processor and a memory (not shown separately within PMC). Operation of defect detection tool 103 and PMC 104 will be further detailed with reference to FIGS. 2A, 2B and 3 below. As will be further detailed with reference to FIGS. 1-3, PMC 104 can execute several functional components in accordance with computer-readable instructions implemented on a non-transitory computer-readable storage medium. Such functional components are referred to hereinafter as included in the PMC.

Processing results of defect detection tool 103 output by output interface 106, may be used to determine and provide inspection instruction related data 123 or review instruction related data 124 to inspection examination tools 101 or review examination tools 102, respectively, in order to modify their operation, for example by changing values of operation parameters.

It is noted that the examination system illustrated in FIG. 1 can be implemented in a distributed computing environment, in which the aforementioned functional modules shown in FIG. 1 can be distributed over several local and/or remote devices, and can be linked through a communication network. It is further noted that in other embodiments at least part of examination tools 101 and/or 102, data repositories 109, storage system 107, design server 110 and/or GUI 108 can be external to the examination system 100 and operate in data communication with defect detection tool 103 via input interface 105 and output interface 106. Defect detection tool 103 can be implemented as a stand-alone computer(s) to be used in conjunction with one or more examination tools. Optionally, defect detection tool 103 can operate on pre-acquired inspection data stored in data repositories 109 and/or storage system 107. Alternatively or additionally, the respective functions of defect detection tool 103 can, at least partly, be integrated with one or more examination tools, process control tools, recipe generation tools, systems for automatic defects review and/or classification, and/or other systems related to examination.

PMC 104 can include image obtaining component 117, defect characteristics obtaining component 119, image modification component 120, defect detection component 121, defect checking component 125, and recipe modification component(s) 126.

Image obtaining component 117 can be used for obtaining and storing in memory one or more captured images captured by inspection examination tool 101. The images may be obtained directly from inspection examination tool 101, from data repositories 109 and/or storage system 107.

Defect characteristics obtaining component 119 can obtain characteristics of one or more defects to be planted within one or more images. The characteristics may include a type, geometrical characteristics, amplitude, parity, electrical characteristics, physical characteristics, a color, or the like. In some embodiments, the defect can be associated with absolute values to be assigned to pixels at the location. In further embodiments, the defect can be associated with a value to be added, subtracted or otherwise used to manipulate an existing value of one or more pixels. In further embodiments, the defect can be associated with a value of one or more pixels relative to the environment, for example a value of 10% or 20% more than the average value of one or more surrounding pixels. In some embodiments, the defect may affect the values of pixels by simulating interaction of a material with materials from other layers which may change the color, opacity or other properties.

One or more defects may also be associated with an exact location with respect to the object, a descriptor of a repetitive location with respect to the object, relative to a pattern, or the like. One or more defects may be associated with no specific location, such that they may be located at any one or more random locations within the image or within the object.

Image modification component 120 can modify one or more images obtained by image obtaining component 117 in accordance with the defect characteristics obtained by defect characteristics obtaining engine 119. Image modification component 120 can modify the image in accordance with the defect characteristics and location, by modifying the values of one or more pixels in the images. In some embodiments, if the defect location is repetitive or random, multiple locations within the image may be modified. If the defect location is exact, pixels at the location may be modified. For one or more defect types, the relevant pixels may be modified using macro-like instructions, while for other types the pixels may be modified into predetermined or calculated values. In further embodiments, one or more pixels may be modified to assume the values of a predetermined image.

Defect detection component 121 can detect defects within an image, using for example one or more detection recipes and thresholds. Defect detection may include comparing between dies, comparing between a die and a predetermined die model, a statistical model, comparing between wafers, or the like. In some embodiments, defect detection component 121 can assign a grade to each pixel in the image, indicating a probability that the pixel reflects a defect or a part of a defect. Then a threshold may be applied, such that the pixels having a grade that exceeds the threshold are reported as potential defects. In some embodiments, the threshold may be constant for the whole images, while in others the threshold may be relative to an environment of a pixel.

Defect checking component 125 may check whether and which of the planted defects obtained by defect characteristics obtaining engine 119 are included in the potential defects output by defect detection component 121. The non-included defects may be reported, such that it may be checked why these defects have not been detected.

Recipe modification component 126 may modify the grade assignment algorithm or the thresholds, or the detection algorithm or thresholds such that one or more of the planted defects that have not been detected, will be detected using the modified algorithms or thresholds. In some embodiments, the capturing parameters used by inspection examination tool 101 may also be modified, including for example polarization, illumination angle, illumination amplitude, or the like.

Those skilled in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and hardware.

Figure 2A:
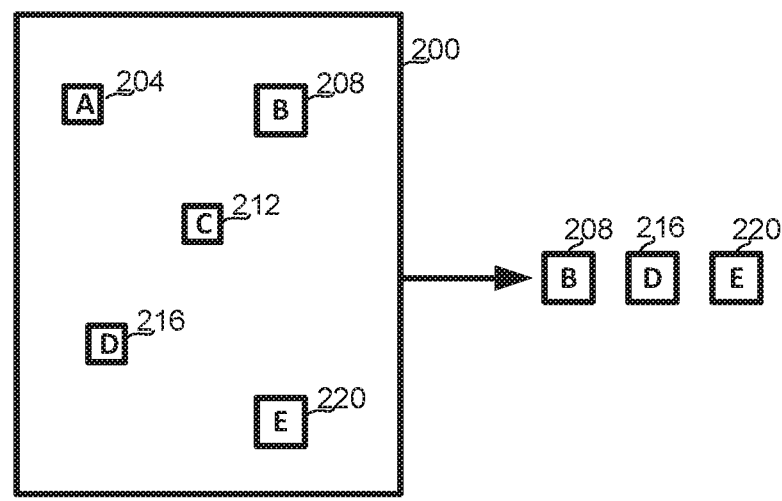
FIG. 2A and FIG. 2B demonstrate a schematic illustration of defect detection in accordance with certain embodiments of the presently disclosed subject matter.
Figure 2B:
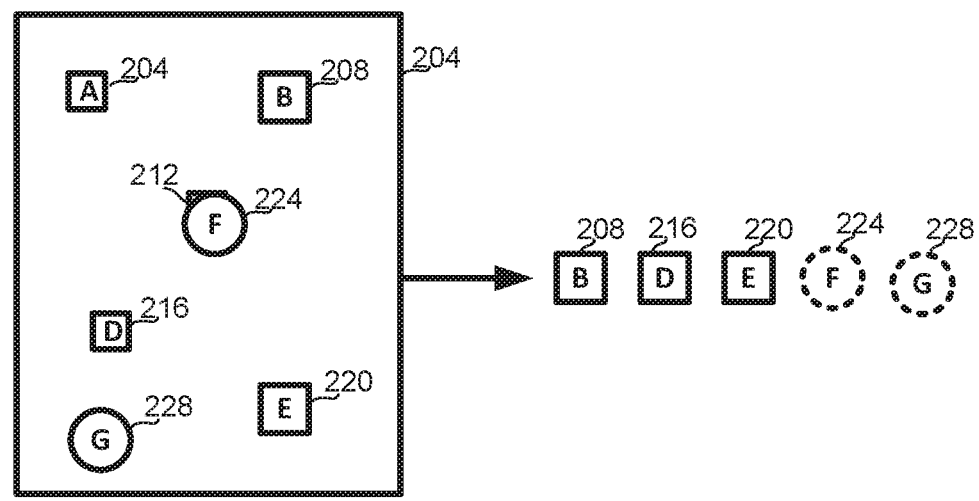

Reference is now made to FIG. 2A and FIG. 2B, demonstrating defect detection in accordance with the disclosure.

FIG. 2A shows a schematic illustration of an examined object 200, having defects A 204. B 208, C 212, D 216 and E 220. The defect detection system detects defects B 208, D 216, and E 220.

However, an operator, management or another entity in charge of object 200 also may require that the area of defect C 212 must be detected, since it is of specific importance. It is also required that defects of a specific type G and/or location are detected. Thus, in accordance with the disclosure, FIG. 2B also shows defect F 224 added in substantially the same area as defect C 212 (for clarity purposes defects C 212 and F 224 are not shown to fully overlap), and defect G 228. Defect G 228 may need to be detected at a specific location, or in an arbitrary location.

Then, when defects are detected in object 200, it may be examined whether defect F 224 and/or defect G 228 are detected, thus bringing to the examiner's attention the area of defect C 212, and defects of type G 228. If any of these defects is not detected, it may be checked why this is so, and modifications may be made to the detection algorithm, thresholds, or other parameters.

Detection may then be repeated to examine whether the modified algorithm, or thresholds indeed cause defects F 224 and G 228 to be detected.

Figure 3:
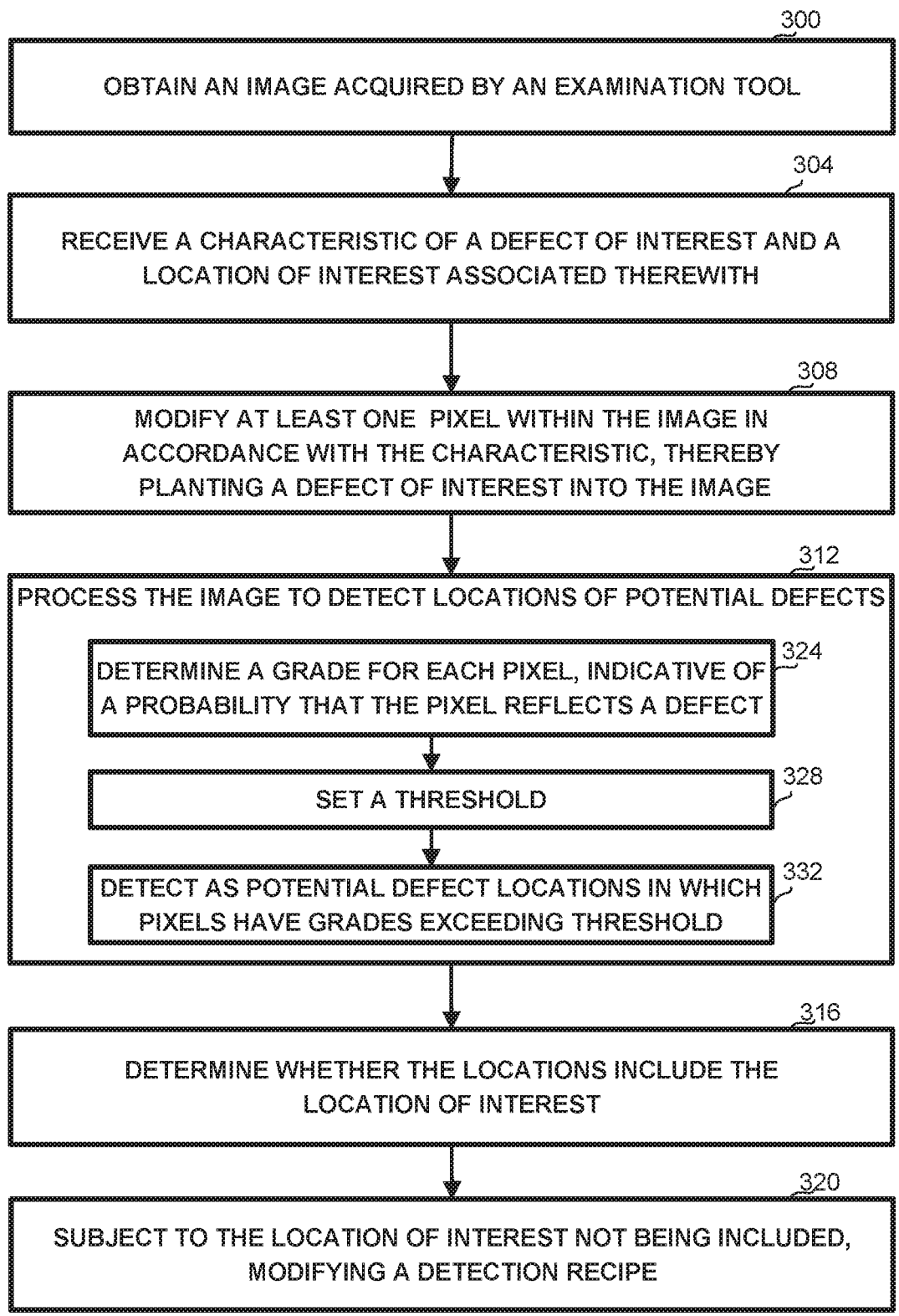
FIG. 3 illustrates a generalized flow-chart of detecting defects in a specimen, in accordance with certain embodiments of the presently disclosed subject matter.

Referring to FIG. 3, there is illustrated a generalized flow-chart of detecting defects in a specimen, in accordance with certain embodiments of the presently disclosed subject matter. PMC 104 can execute the respective operations detailed below in accordance with computer-readable instructions implemented on a non-transitory computer-readable storage medium.

The flowchart of FIG. 3 can be used in a plurality of scenarios. One scenario relates to a setup situation, in which a recipe for testing specimens of a specific type is determined. Another scenario is at run-time, when actual specimens are being examined in accordance with the determined recipe.

Image obtaining component 118 obtains (300) an image acquired by an examination tool, such as inspection examination tool 101. The image may be obtained directly from inspection examination tool 101, from a storage device, or the like.

Defect characteristics obtaining component 119 is adapted to obtain (304) one or more characteristics of a defect of interest, and a location of interest associated therewith. The characteristics may be obtained from a user using GUI 108, from a file, or the like. The characteristics may include color, size, shape, a predetermined type, electrical functionality, interaction type with wafer material or any another characteristic. The location may be exact, relative to a predetermined pattern, another defect, repetitive, or random.

Typically, defect characteristics may be received during the setup of a detection recipe for a specimen type. During runtime, however, the defects may already be stored, for example in a memory accessible to image modification component 120 described below, and thus need not be obtained, such that step 304 may be omitted.

Responsive to receiving characteristics of one or more defects of interest at 304 above during setup, or if the characteristics are already available during runtime, image modification component 120 can modify (308) one or more pixels within a received image in accordance with the defect characteristics as obtained (304) by defect characteristics obtaining component 119. Modification may include changing the value of a pixel to a predetermined value, changing the value of a pixel in accordance with a current value and a modification, such as a number to add, change a value of a pixel in accordance with values of neighboring pixels, or the like. Modification may also change a multiplicity of pixels in accordance with a defect type. For example, a short circuit may imply changing the values of pixels along a line connecting two locations. Modification may be performed by executing a macro performing certain actions on the image.

Defect detection component 121 can detect (312) defects within an image, such as the image modified (308) by image modification component 120. Detecting defects 312 may include determining a grade (324) for each pixel within the image, the grade indicative of a probability that the pixel represents a defect or a part of a defect. One or more thresholds may then be obtained (328) from a user using GUI 108, from a file, or as a predetermined value. A constant threshold may be used for the whole image. Additionally or alternatively, different areas of the image may be associated with different thresholds. As detailed above, detection may include comparison between dies, comparison between wafers, comparison between a wafer and a model, or the like.

Potential defects may then be detected (332) at the locations of pixels having a grade that exceeds the applicable threshold. Determining the grade 324 and/or determining the threshold 328 may be performed in accordance with an applicable recipe which may be received from a user, retrieved from a storage device, predetermined or obtained in any other manner.

Defect checking component 125 may then check (316) whether defects have been detected by defect detection component 121 at the locations of the defects whose characteristics were received by defect characteristics obtaining component 119 and that have been planted into the image (308).

If not all the required defects have been detected, then recipe modification component 126 may modify (320) the detection recipe used for detecting the defects. In some embodiments, the image capturing parameters may be modified. In further embodiments, other steps may be performed subject to the defects being or not being detected.

Those skilled in the art will readily appreciate that the teachings of the presently disclosed subject matter are not bound by the method illustrated in FIG. 3. Other appropriate algorithms and combinations thereof can be implemented in order to obtain minority defects and train a classifier accordingly.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

It will also be understood that the system according to the invention may be, at least partly, implemented on a suitably programmed computer. Likewise, the invention contemplates a computer program being readable by a computer for executing the method of the invention. The invention further contemplates a non-transitory computer-readable memory tangibly embodying a program of instructions executable by the computer for executing the method of the invention.

Those skilled in the art will readily appreciate that various modifications and changes can be applied to the embodiments of the invention as hereinbefore described without departing from its scope, defined in and by the appended claims.

What is claimed is:

1. An examination system to detect defects in run-time during fabrication of a specimen, the examination system comprising a processing and memory circuitry (PMC) configured to:
   obtain a runtime image of at least a part of a specimen, the runtime image acquired by an examination tool, and the runtime image comprising a plurality of pixels;
   receive at least one characteristic of a defect of interest and a location of interest associated therewith, wherein the defect of interest is indicative of a specimen abnormality formed on or within the specimen at the location of interest;
   modify, in accordance with the at least one characteristic, image data informative of at least one pixel from the plurality of pixels of the runtime image and corresponding to the location of interest, thereby planting the defect of interest in the image data at the location of interest and obtaining modified image data;
   process the modified image data to detect a set of locations of potential defects of the specimen in accordance with a detection recipe, wherein the detection recipe is generated prior to processing the modified image data;
   determine whether the set of locations of potential defects includes the location of interest; and
   subject to determining that the location of interest is not included in the set of locations of potential defects, modify the detection recipe to enable detection of the defect of interest planted at the location of interest.

2. The examination system of claim 1, wherein the at least one pixel has a value that is changed to an absolute value.

3. The examination system of claim 1, wherein, in modifying the image data, the PMC is further configured to add, to a value of the at least one pixel, a second value provided as part of the at least one characteristic.

4. The examination system of claim 1, wherein the detection recipe comprises a set of instructions comprising:
   determining a grade for each pixel from the plurality of pixels, the grade indicative of a probability that the pixel reflects a defect or a part thereof;
   setting a threshold; and detecting as potential defects only pixels for which the respective grade exceeds the threshold.

5. The examination system of claim 4, wherein in modifying the detection recipe, the PMC modifies the threshold in the detection recipe to enable detection of the defect of interest planted at the location of interest.

6. The examination system of claim 1, wherein the location of interest is at least one of: an absolute location, a repetitive location, a random location, a location relative to a predetermined pattern, or a location relative to a predetermined location.

7. The examination system of claim 1, wherein the at least one characteristic comprises at least one of: a type, a color, a geometrical characteristic, an amplitude, a parity, an electrical characteristic, or a physical characteristic.

8. A method of detecting defects in run-time during fabrication of a specimen, the method comprising:
   obtaining, by a processing and memory circuitry (PMC), a runtime image of at least a part of a specimen, the runtime image acquired by an examination tool, and the runtime image comprising a plurality of pixels;
   receiving, by the PMC, at least one characteristic of a defect of interest and a location of interest associated therewith, wherein the defect of interest is indicative of a specimen abnormality formed on or within the specimen at the location of interest;
   modifying, by the PMC in accordance with the at least one characteristic, image data informative of at least one pixel from the plurality of pixels of the runtime image and corresponding to the location of interest, thereby planting the defect of interest in the image data at the location of interest and obtaining modified image data;
   processing, by the PMC, the modified image data to detect a set of locations of potential defects of the specimen in accordance with a detection recipe, wherein the detection recipe is generated prior to processing the modified image data;
   determining, by the PMC, whether the set of locations of potential defects includes the location of interest; and
   subject to determining that the location of interest is not included in the set of locations of potential defects, modifying, by the PMC, the detection recipe to enable detection of the defect of interest planted at the location of interest.

9. The method of claim 8, wherein the at least one pixel has a value that is changed to an absolute value.

10. The method of claim 8, wherein modifying the image data comprises adding, to a value of the at least one pixel, a second value provided as part of the at least one characteristic.

11. The method of claim 8, wherein the detection recipe comprises a set of instructions to:
   determine a grade for each pixel from the plurality of pixels, the grade indicative of a probability that the pixel reflects a defect or a part thereof;
   set a threshold; and
   detect as potential defects only pixels for which the respective grade exceeds the threshold.

12. The method of claim 11 further comprising: wherein modifying the detection recipe comprises modifying the threshold in the detection recipe to enable detection of the defect of interest planted at the location of interest.

13. The method of claim 8, wherein the location of interest is at least one of: an absolute location, a repetitive location, a random location, a location relative to a predetermined pattern, or a location relative to a predetermined location.

14. The method of claim 8, wherein the at least one characteristic comprises at least one of: a type, a color, a geometrical characteristic, an amplitude, a parity, an electrical characteristic, or a physical characteristic.

15. A non-transitory computer readable storage medium comprising instructions, which when executed by a processor in run-time during fabrication of a specimen, cause the processor to perform operations comprising:
   obtaining a runtime image of at least a part of a specimen, the runtime image acquired by an examination tool, and the runtime image comprising a plurality of pixels;
   receiving at least one characteristic of a defect of interest and a location of interest associated therewith, wherein the defect of interest is indicative of a specimen abnormality formed on or within the specimen at the location of interest;
   modifying, in accordance with the at least one characteristic, image data informative of at least one pixel from the plurality of pixels of the runtime image and corresponding to the location of interest, thereby planting the defect of interest in the image data at the location of interest and obtaining modified image data;
   processing the modified image data to detect a set of locations of potential defects of the specimen in accordance with a detection recipe, wherein the detection recipe is generated prior to processing the modified image data;
   determining whether the set of locations of potential defects includes the location of interest; and
   subject to determining that the location of interest is not included in the set of locations of potential defects, modifying the detection recipe to enable detection of the defect of interest planted at the location of interest.

16. The non-transitory computer readable storage medium of claim 15, wherein modifying the image data comprises adding, to a value of the at least one pixel, a second value provided as part of the at least one characteristic.

17. The non-transitory computer readable storage medium of claim 15, wherein the detection recipe comprises a set of instructions to:
   determine a grade for each pixel from the plurality of pixels, the grade indicative of a probability that the pixel reflects a defect or a part thereof;
   set a threshold; and
   detect as potential defects only pixels for which the respective grade exceeds the threshold.

* * * * *